United States Patent [19]

Lach

[11] Patent Number: 4,636,654
[45] Date of Patent: Jan. 13, 1987

[54] GAAS DIFFERENTIAL LINE RECEIVER WITH POSITIVE FEEDBACK

[75] Inventor: Lawrence E. Lach, Chicago, Ill.

[73] Assignee: Gould Inc., Rolling Meadows, Ill.

[21] Appl. No.: 784,983

[22] Filed: Oct. 7, 1985

[51] Int. Cl.⁴ .................. H03K 3/356; H04B 1/24; H04L 25/08
[52] U.S. Cl. ........................... 307/260; 307/200 B; 307/443; 307/491; 307/493; 307/497; 307/279; 307/264; 178/63 C; 375/36
[58] Field of Search ............ 307/443, 448, 450, 513, 307/572, 581, 260, 279, 355, 264, 200 B, 479, 491, 493, 497; 178/63 C; 375/36; 330/253

[56] References Cited

U.S. PATENT DOCUMENTS

| | | | |
|---|---|---|---|
| 3,329,835 | 7/1967 | D'Agostino | 307/443 |
| 3,718,762 | 2/1973 | Nezu et al. | 375/36 |
| 4,393,315 | 7/1983 | Stickel et al. | 307/475 X |
| 4,395,645 | 7/1983 | Pernyeszi | 307/475 X |
| 4,410,815 | 10/1983 | Ransom et al. | 307/448 X |

FOREIGN PATENT DOCUMENTS 0084844  8/1983  European Pat. Off. ............ 307/279

Primary Examiner—Larry N. Anagnos
Attorney, Agent, or Firm—John R. Garrett; Edward E. Sachs

[57] ABSTRACT

A gallium arsenide differential line receiver circuit has a first and second receiver means for receiving first and second differential input signal voltages. A pair of depletion transistor means for transforming the signal voltages into corresponding signal currents provides pull-up, and the depletion transistors have their gates operatively connected to the first and second receiver means. A pair of enhancement transistor means is operatively connected to the pair of depletion transistor means for outputting a gallium arsenide signal representation of the first and second differential input signal voltages. Positive feedback is provided for increasing the gain of the pair of enhancement transistors and is operatively connected to the pair of enhancement transistors. Shunting means is also provided for reducing hysteresis switching and is operatively connected to the pair of enhancement transistors.

11 Claims, 4 Drawing Figures

GAAS DIFFERENTIAL LINE RECEIVER WITH POSITIVE FEEDBACK

BACKGROUND OF THE INVENTION

The present invention relates in general to differential line receivers and, in particular, differential line receivers using gallium arsenide (GaAs) devices.

Differential line receivers are well known in the prior art and have been typically used for transferring data over predetermined lengths of twisted cable or various other types of electrical lines. The differential line receiver receives two signals which are 180 electrical degrees out of phase with each other. The differential line receiver combines these signals into one signal. The advantage of the differential line receiver is the minimization of electrical noise relative to the original signal. The transmitter of the two signals splits the original signal into a positive and negative part which are 180 electrical degrees apart.

Conventional differential stages of differential amplifiers typically use a common, high-impedance current source to achieve gain. Corresponding designs in gallium arsenide do not work well because of complications associated with MESFET's and the forward bias of the Schottky junctions.

The present invention of a gallium arsenide circuit used in a differential line receiver overcomes the problems state above in the prior art. A feature of the present invention is that the line receiver exhibits a substantial degree of immunity to process and temperature variables. A further advantage of this invention is that the line receiver is structurally simple and has a small silicon area requirement. The structural symmetry minimizes sensitivity to temperature and process variables. A further advantage in the present invention is the use of positive feedback to provide gain for the gallium arsenide differential line receiver circuit.

Although the present invention relates to gallium arsenide devices, the invention can also be used with other semiconductor technologies which support MESFET transistor structures. For example, technologies using InP devices.

SUMMARY OF THE INVENTION

The present invention involves a gallium arsenide differential line receiver circuit. The circuit has a first and second receiver means for receiving first and second differential input signal voltages. A pair of depeletion transistor means for transforming the signal voltages into corresponding signal currents provides pull-up, and the depletion transistors have their gates operatively connected to the first and second receiver means. A pair of enhancement transistor means is operatively connected to the pair of depletion transistor means for outputting a gallium arsenide signal representation of the first and second differential input signal voltages. Positive feedback is provided for increasing the gain of the pair of enhancement transistors and is operatively connected to the pair of enhancement transistors. Shunting means is also provided for reducing hysteresis switching and is operatively connected to the pair of enhancement transistors.

BRIEF DESCRIPTION OF THE DRAWINGS

The features of the present invention which are believed to be novel are set forth with particularity in the appended claims. The invention together with further objects and advantages may best be understood by reference to the following description taken in conjunction with the accompanying drawings, in the several figures of which like reference numerals identify like elements, and in which:

DESCRIPTION OF THE PREFERRED EMBODIMENT

The present invention involves use of gallium arsenide devices in a differential line receiver. The present circuit uses positive feedback to provide gain in the circuit and also provides a symmetry in circuit design which provides for process and temperature insensitivity when the circuit is formed in an integrated circuit.

Figure 1:
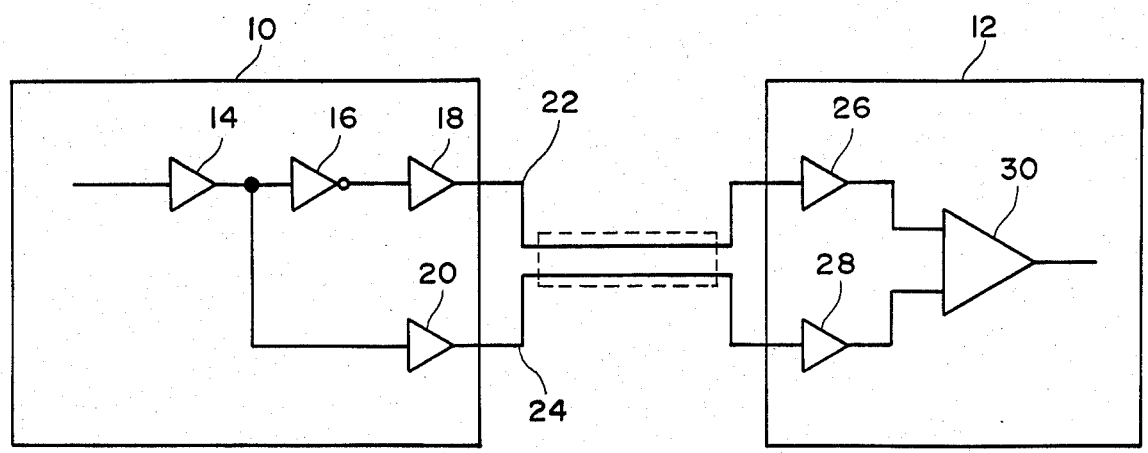
FIG. 1 is a block diagram functionally representating the operation of the differential line receiver.

In general terms the differential line receiver is typically used with twisted pair cables and other types of transmission cables wherein it is desirable to insure that electrical noise or other interference is eliminated from a transmitted signal. As shown in FIG. 1 in block diagram form a signal which is to be transmitted from a transmitter 10 a receiver 12 is split into a positive and negative component which are 180 electrical degrees apart by the circuitry comprised of amplifiers 14, 16, 18 and 20 in the transmitter 10. The positive component of the original signal appears on line 22 and the negative component on line 24. These two signals are received at the receiver 12 and in general are amplified by amplifiers 26 and 28 and then combined in the differential amplifier 30 to reproduce the original signal.

Figure 2:
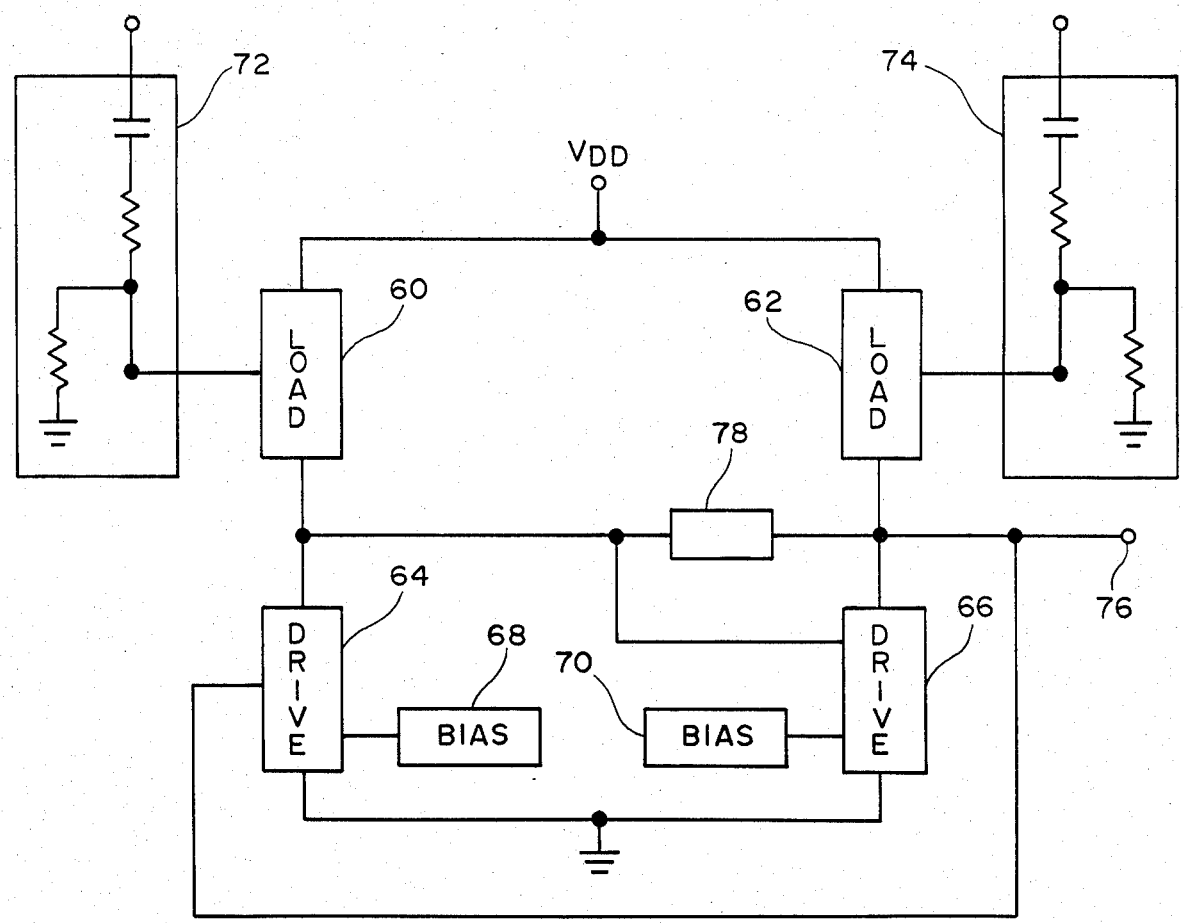
FIG. 2 is a general block diagram of the present invention.

In general terms, as shown in FIG. 2, the present invention has a pair of load elements 60 and 62 for providing pull up operatively connected to a pair of driver elements 64 and 66 for providing pull down. These elements utilize MESFET transistor structures and can be structured for use with a variety of logic families. Depending upon the type of logic family chosen, the biasing 68 and 70 is selected to define cutoff and the asociated logic state.

Load element 60 receives a first differential signal from receiving means 72 and load element 62 receives a second differential signal from receiving means 74. The input to driver element 66 is from load element 60 and the input to driver element 64 is an output signal appearing on output terminal 76. Thus, the circuit has positive feedback which provides the necessary circuit gain. A shunting means 78 is connected between the two pairs of load and driver elements as shown in FIG. 2.

An important feature of the present circuit is its structural symmetry. Because of the symmetry, compatability between this circuit and other associated logic circuitry is maximized for process and temperature variations.

Figure 3:
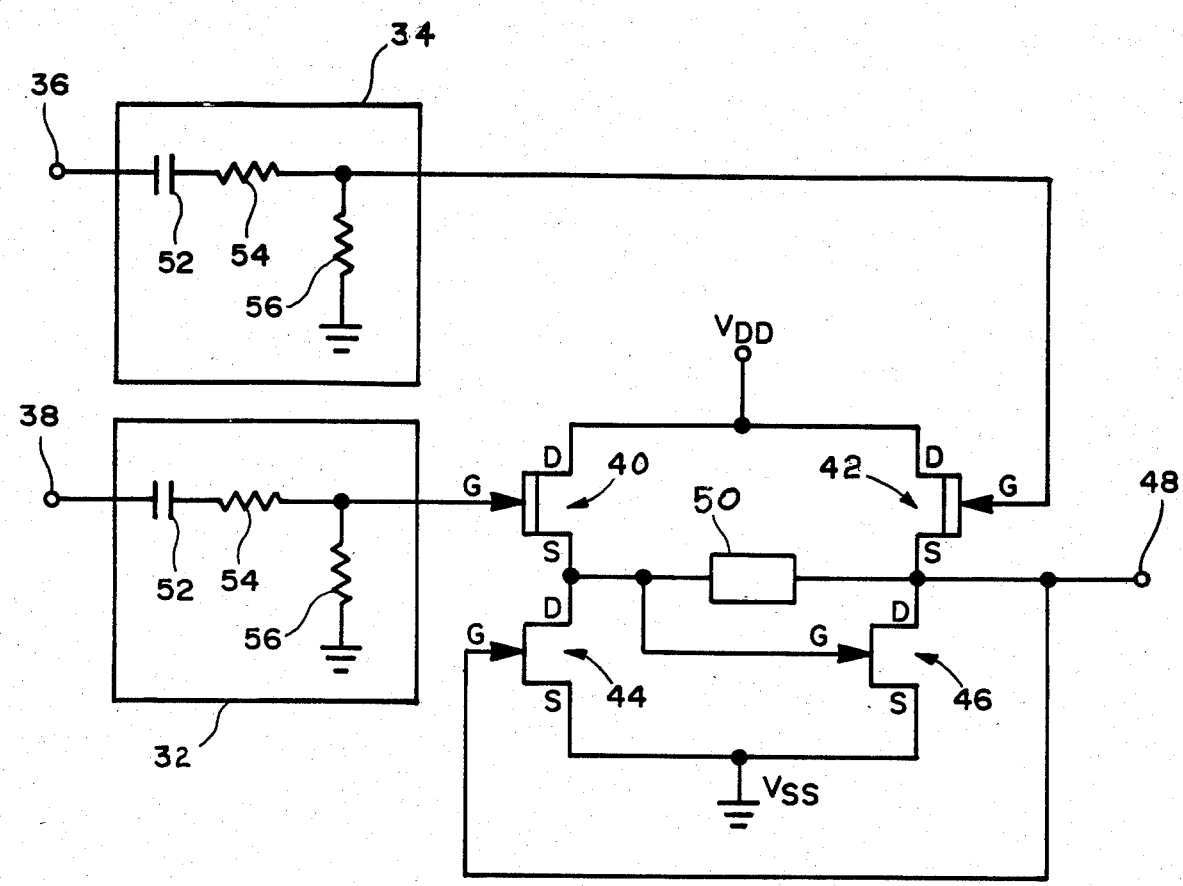
FIG. 3 is a schematic diagram of a differential line receiver structured according to the present invention.

FIG. 3 shows in schematic form a gallium arsenide circuit constructed according to the present invention. First and second receiver means 32 and 34 are provided for receiving first and second differential input signals on input terminals 36 and 38, respectively. First and second depletion transistors 40 and 42 have their drains operatively connected to a first predetermined voltage source $V_{DD}$. The first depletion transistor 40 has its gate operatively connected to the first receiving means 32 and the second depletion transistor 42 has its gate operatively connected to the second receiving means 34. First and second enhancement transistors 44 and 46 have their sources operatively connected to a second predetermined voltage source $V_{SS}$. The first enhancement transistor 44 has its drain operatively connected to a source of the first depletion transistor 42. The second enhancement transistor 46 has its gate also operatively connected to the source of the first depletion transistor 42. The second enhancement transistor 46 has its drain operatively connected to a source of the second depletion transistor. A gallium arsenide signal appearing on the drain of the second enhancement transistor is the recombined first and second input signals. The drain of the second enhancement transistor 46 is also operatively connected to the gate of the first enhancement transistor 44 thereby providing positive feedback. The gallium arsenide signal also appears on the output terminal 48 which is connected to the drain of the second enhancement transistor 46. The shunting means 50 is provided for reducing hysteresis switching and is operatively connected between the drains of the first and second enhancement transistors 44 and 46.

Each of the first and second receiver means 32 and 34 may be comprised in the preferred embodiment of a series capacitor 52 for minimizing the effect of the limited operating point of the gallium arsenide circuit. A resistive divider network, shown in FIG. 3 as resistors 54 and 56, is provided for establishing a predetermined input impedance, typically 50 ohms.

Figure 4:
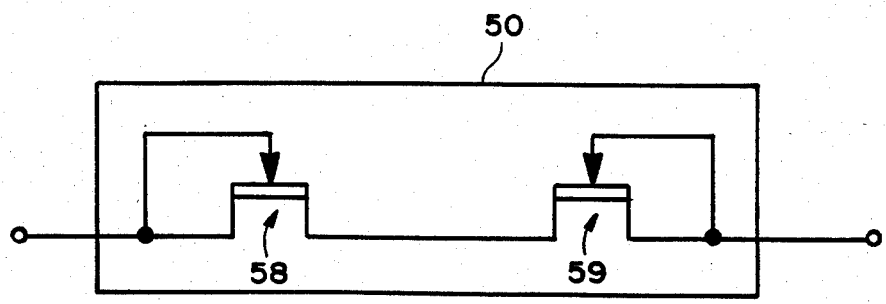
FIGS. 4 is a schematic diagram illustrating the shunting means used in the FIG. 2 circuit diagram.

Referring now to FIG. 4 a schematic circuit is shown to represent the shunting means 50 in the Figure 3 circuit. The shunting means 50 can be defined as any two-terminal device which passes current in response to an electrical voltage stimulus. Such shunting means include networks of resistors, diodes, and other semiconductor devices. In the preferred embodiment the shunting means 50 is a pair of depletion transistors 58 and 59 operatively connected in a back to back configuration. The impedance of the shunting means 50 has IV characteristics which track the IV characteristics of the circuit transistors.

The invention is not limited to the particular details of the apparatus depicted and other modifications and applications are contemplated. Cetain other changes may be made in the above described apparatus without departing from the true spirit and scope of the invention herein involved. It is intended therefore that the subject matter in the above depiction shall be interpreted as illustrative and not in the limiting sense.

What is claimed is:

1. A MESFET differential line receiver circuit comprising:
    first and second receiver means for receiving first and second differential input signal voltages;
    a pair of load element means each connected between a first voltage supply terminal and a respective load element means output
    for transforming said received signal voltages into corresponding signal currents to provide pull up at said load element means outputs and connected to said first and second receiver means, respectively;
    a pair of driver element means each connected between a respective one of said pair of load element means outputs and a second voltage supply terminal for outputting a predetermined signal representation of said first and second differential input signal voltages at one of said load element means outputs;
    positive feedback means for increasing the gain of said pair of driver element means and connected to said pair of driver element means as regenerative feedback connections; and
    at least two depletion transistors operatively connected in a back to back configuration
    between the respective driver and load element means connections for reducing hysteresis switching to said pair of driver element means.

2. The circuit described in claim 1 wherein each of said first and second receiving means comprises at least a DC blocking capacitor connected to an input terminal of the respective receiving means for minimizing the effect of the limited operating point of the MESFET circuit.

3. The circuit described in claim 1 wherein each of said first and second receiving means comprises a resistive network for establishing a predetermined input impedance.

4. A GaAs differential line receiver circuit comprising:
    first and second receiver means for receiving first and second differential input signal voltages:
    a pair of depletion transistors means for transforming the signal voltages into corresponding signal currents to provide pull up, having their drains operatively connected to a first predetermined voltage source and having their gates operatively connected to said first and second receiver means, respectively;
    a pair of enhancement transistor means having their sources operatively connected to a second predetermined voltage source and operatively connected to said pair of depletion transistor means for outputting a GaAs signal representation of said first and second differential input signal voltages, said pair of enhancement transistor means having further positive feedback connections for increasing their respective gain including a first enhancement transistor of said pair of enhancement transistors having its drain operatively connected to a source of a first depletion transistor of said pair of depletion transistors, a second enhancement transistor of said pair of enhancement transistors having its gate operatively connected to said source of said first depletion transistor, and said second enhancement transistor having its drain operatively connected to a source of a second depletion transistor of said pair of depletion transistors and to a gate of said first enhancement transistor, said GaAs signal appearing on said drain of said first enhancement transistor;
    shunting means for reducing hysteresis switching operatively connected to said drains of said pair of enhancement transistors means.

5. The circuit described in claim 4 wherein said shunting means comprises at least two depletion transistors operatively connected in a back to back configuration.

6. The circuit described in claim 4 wherein each of said first and second receiving means comprises at least a DC blocking capacitor connected to an input terminal of the respective receiving means for minimizing the effect of the limited operating point of the GaAs circuit.

7. The circuit described in claim 4 wherein each of said first and second receiving means comprises a resistive network for establishing a predetermined input impedance.

8. A GaAs differential line receiver circuit comprising:
   first and second receiver means for receiving first and second differential input signals;
   first and second depletion transistors having their drains operatively connected to a first predetermined voltage source, said first depletion transistor having its gate operatively connected to said first receiving means and said second depletion transistor having its gate operatively connected to said second receiving means;
   first and second enhancement transistors having their sources operatively connected to a second predetermined voltage source, said first enhancement transistor having its drain operatively connected to a source of said first depletion transistor, said second enhancement transistor having its gate operatively connected to said source of said first depletion transistor, and said second enhancement transistor having its drain operatively connected to a source of said second depletion transistor and to a gate of said first enhancement transistor, a GaAs signal appearing on said drain of said second enhancement transistor; and
   shunting means for reducing hysteresis switching operatively connected between said drains of said first and second enhancement transistors.

9. The circuit described in claim 8 wherein said shunting means comprises at least two depletion transistors operatively connected in a back to back configuration.

10. The circuit described in claim 8 wherein each of said first and second receiving means comprises at least a DC blocking capacitor connected to an input terminal of the respective receiving means for minimizing the effect of the limited operating point of the GaAs circuit.

11. The circuit described in claim 8 wherein each of said first and second receiving means comprises a resistive network for establishing a predetermined input impedance.

* * * * *